United States Patent
Lin et al.

(10) Patent No.: US 7,682,884 B2
(45) Date of Patent: Mar. 23, 2010

(54) METHOD FOR FABRICATING PIXEL STRUCTURE

(75) Inventors: Han-Tu Lin, Hsinchu (TW);
Chih-Chun Yang, Hsinchu (TW);
Ming-Yuan Huang, Hsinchu (TW);
Chih-Hung Shih, Hsinchu (TW);
Ta-Wen Liao, Hsinchu (TW); Chia-Chi Tsai, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 82 days.

(21) Appl. No.: 12/017,342

(22) Filed: Jan. 22, 2008

(65) Prior Publication Data

US 2009/0087954 A1    Apr. 2, 2009

(30) Foreign Application Priority Data

Oct. 1, 2007    (TW) .............................. 96136778 A (51) Int. Cl.
*H01L 21/00*    (2006.01)
(52) U.S. Cl. ............... 438/151; 438/158; 257/E21.001; 257/E21.411
(58) Field of Classification Search ................. 438/151, 438/158; 257/E21.001, E21.411
See application file for complete search history.

(56) References Cited

U.S. PATENT DOCUMENTS 5,514,618 A * 5/1996 Hunter et al. ................. 438/30
6,432,755 B2 * 8/2002 Sung et al. ................... 438/158
2005/0179036 A1 8/2005 Yamazaki et al.
2006/0099747 A1 5/2006 Park

FOREIGN PATENT DOCUMENTS

CN    1770017    5/2006

OTHER PUBLICATIONS

Stanley Wolf and Richard Tauber, Silicon Processing For The VLSI Era, 1986, Lattice Press, vol. I, pp. 407-409.*
Authored by A. Borowice, et al., article titled "Wavelength dependence of the single pulse femtosecond laser ablation threshold of indium phosphide in the 400-2050 nm range," adopted from Applied Surface science , vol. 243, 2005, pp. 129-137.

* cited by examiner

*Primary Examiner*—Charles D Garber
*Assistant Examiner*—Stanetta D Isaac
(74) *Attorney, Agent, or Firm*—Jianq Chyun IP Office (57) ABSTRACT

A method for fabricating a pixel structure using a laser ablation process is provided. This fabrication method forms a gate, a channel layer, a source, a drain, a passivation layer, and a pixel electrode sequentially by using a laser ablation process. Particularly, the fabrication method is not similar to a photolithography and etching process, so as to reduce the complicated photolithography and etching processes, such as spin coating process, soft-bake, hard-bake, exposure, developing, etching, and stripping. Therefore, the fabrication method simplifies the process and thus reduces the fabrication cost.

21 Claims, 7 Drawing Sheets

METHOD FOR FABRICATING PIXEL STRUCTURE

CROSS-REFERENCE TO RELATED APPLICATION

This application claims the priority benefit of Taiwan application serial no. 96136778, filed on Oct. 1, 2007. The entirety of the above-mentioned patent application is hereby incorporated by reference herein and made a part of this specification.

BACKGROUND OF THE INVENTION

1. Field of the Invention

The present invention relates to a method for fabricating a pixel structure. More particularly, the present invention relates to a method for fabricating a pixel structure using a laser ablation process.

2. Description of Related Art

Displays are a communication interface between human and information. Currently, flat panel displays are the main trend in development. The flat panel displays may mainly have the following categories: organic electroluminescence display, plasma display, and thin film transistor liquid crystal display (TFT-LCD), in which TFT-LCD is the most widely used. In general, a TFT-LCD is constituted by a TFT array substrate, a color filter array substrate, and a liquid crystal layer. The TFT array substrate includes a plurality of scan lines, a plurality of data lines, and a plurality of pixel structures arranged in an array. Each pixel structure is electrically connected to the corresponding scan line and data line.

Figure 1A:
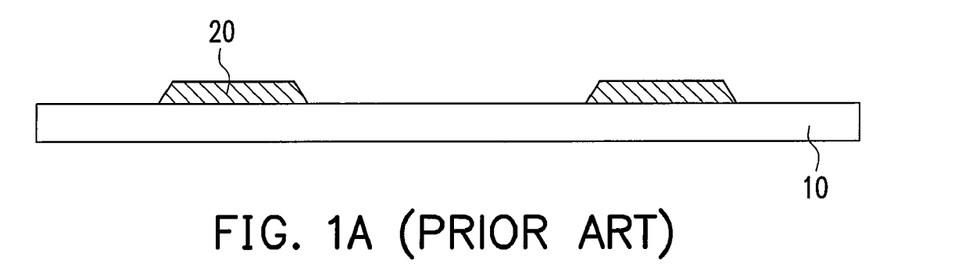
FIGS. 1A to 1G are schematic views of a conventional method for fabricating a pixel structure.
Figure 1B:
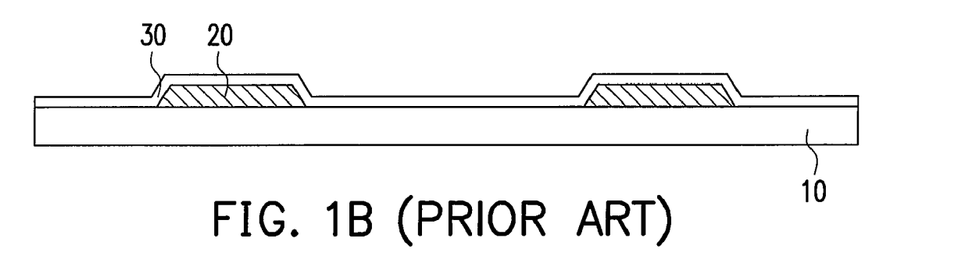
Figure 1C:
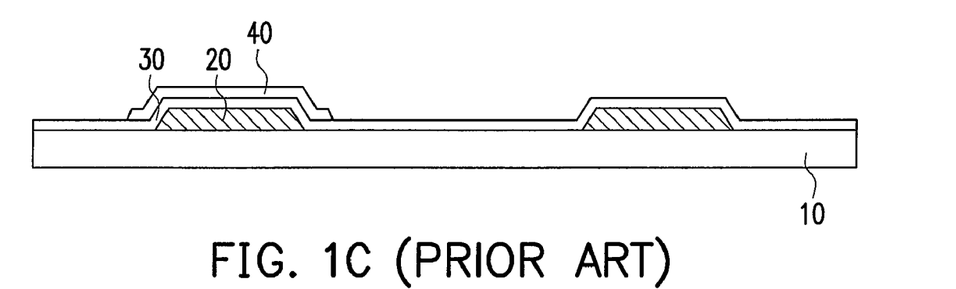
Figure 1D:
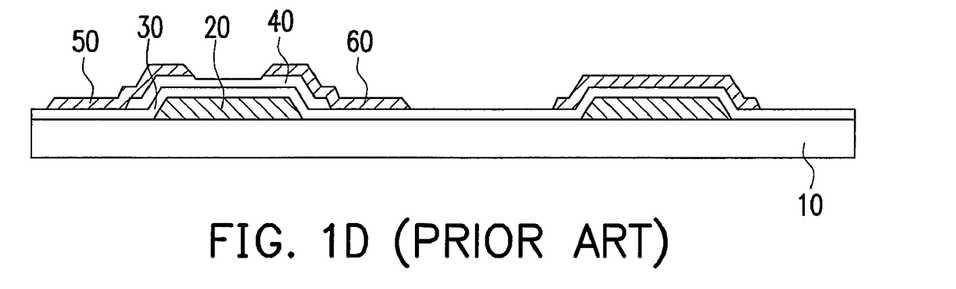
Figure 1E:
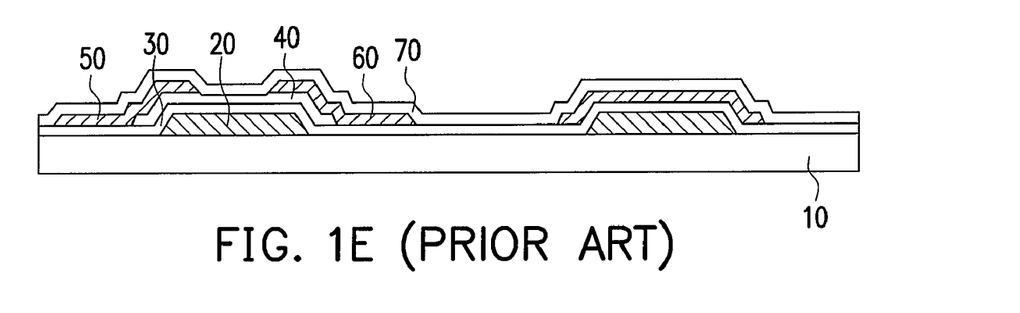
Figure 1F:
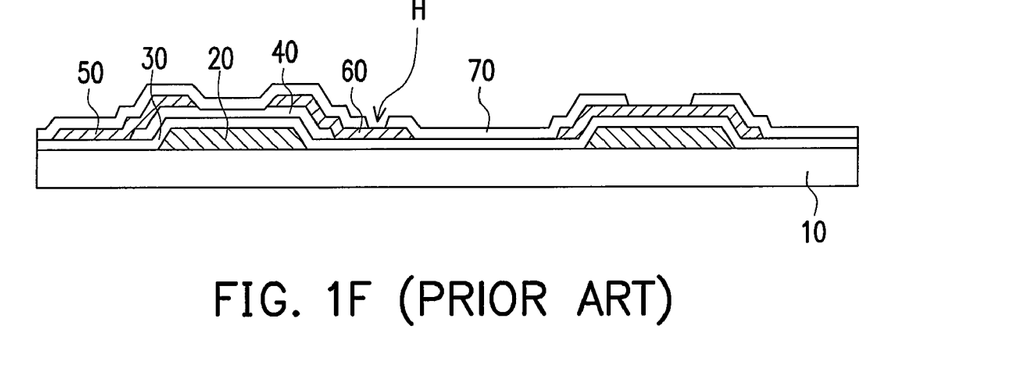
Figure 1G:
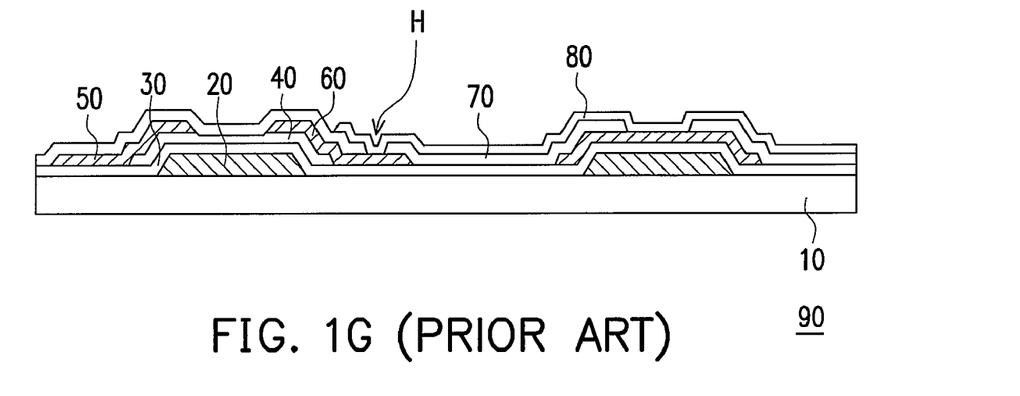

FIGS. 1A to 1G are schematic views of a conventional method for fabricating a pixel structure. Referring to FIG. 1A, first, a substrate 10 is provided, and a gate electrode 20 is formed on the substrate 10 using a first photolithography and etching process. Next, referring to FIG. 1B, a gate insulating layer 30 is formed on the substrate 10 to cover the gate electrode 20. Afterwards, referring to FIG. 1C, a channel layer 40 above the gate electrode 20 is formed on the gate insulating layer 30 using a second photolithography and etching process. In general, a material of the channel layer 40 is amorphous silicon. Then, referring to FIG. 1D, a source electrode 50 and a drain electrode 60 are formed on partial regions of the channel layer 40 and the gate insulating layer 30 using a third photolithography and etching process. Observed from FIG. 1D, the source electrode 50 and the drain electrode 60 respectively extend onto the gate insulating layer 30 from both sides of the channel layer 40, and expose a portion of the channel layer 40. Next, referring to FIG. 1E, a passivation layer 70 is formed on the substrate 10 to cover the gate insulating layer 30, the channel layer 40, the source electrode 50, and the drain electrode 60. Thereafter, referring to FIG. 1F, the passivation layer 70 is patterned by a fourth photolithography and etching process to form a contact hole H in the passivation layer 70. In FIG. 1F, the contact hole H in the passivation layer 70 exposes a portion of the drain electrode 60. Then, referring to FIG. 1G, a pixel electrode 80 is formed on the passivation layer 70 by a fifth photolithography and etching process, and observed from FIG. 1G, the pixel electrode 80 is electrically connected to the drain electrode 60 through the contact hole H. After the pixel electrode 80 is formed, the fabrication of the pixel structure 90 is completed.

In view of the above, the conventional pixel structure 90 is mainly fabricated by the five photolithography and etching processes. In other words, the pixel structure 90 must be fabricated with the five photo-masks of the different patterns. The photo-masks are of high price, and each photolithography and etching process requires a photo-mask of a different pattern. If the photolithography and etching processes cannot be simplified, the fabrication cost of the conventional pixel structure cannot be reduced. Besides, with the increasing of the size of the TFT-LCD panel, the size of the photo-mask for fabricating the TFT array substrate is also enlarged, so the photo-mask of a larger size becomes more expensive, and the fabrication cost of the conventional pixel structure cannot be effectively lowered.

SUMMARY OF THE INVENTION

The present invention is directed to a method for fabricating a pixel structure capable of reducing the fabrication cost of the pixel structure.

As embodied and broadly described herein, the present invention provides a method for fabricating a pixel structure. First, a substrate is provided, and a first conductive layer is formed on the substrate. Next, a first shadow mask is provided above the first conductive layer, and the first shadow mask exposes a portion of the first conductive layer. The first conductive layer is irradiated by a laser beam through the first shadow mask, so as to remove the portion of the first conductive layer exposed by the first shadow mask to form a gate electrode. Afterwards, a gate insulating layer is formed on the substrate to cover the gate electrode, and a semiconductor layer is formed on the gate insulating layer. Then, a second shadow mask is provided above the semiconductor layer, and the second shadow mask exposes a portion of the semiconductor layer. The semiconductor layer is irradiated by a laser beam through the second shadow mask, so as to remove the portion of the semiconductor layer exposed by the second shadow mask to form a channel layer. After that, a second conductive layer is formed on the channel layer and the gate insulating layer. A third shadow mask is then provided above the second conductive layer, and the third shadow mask exposes a portion of the second conductive layer. The second conductive layer is irradiated by a laser beam through the third shadow mask, so as to form a source electrode and a drain electrode on the channel layer at both sides of the gate electrode. The gate electrode, the channel layer, the source electrode, and the drain electrode constitute a TFT. Next, a passivation layer is formed on the gate insulating layer and the TFT. A fourth shadow mask is provided above the passivation layer, and exposes a portion of the passivation layer. The passivation layer is irradiated by a laser beam through the fourth shadow mask, so as to form a contact opening in the passivation layer to expose a portion of the drain electrode. After that, a third conductive layer is formed to cover the passivation layer. A fifth shadow mask is provided above the third conductive layer, and exposes a portion of the third conductive layer. The third conductive layer is irradiated by a laser beam through the fifth shadow mask, so as to make the remaining third conductive layer to form a pixel electrode. The pixel electrode is connected to the drain electrode through the contact opening.

Another method for fabricating a pixel structure is provided. First, a substrate is provided, and a gate electrode is formed on the substrate using a laser ablation process. Then, a gate insulating layer is formed on the substrate to cover the gate electrode. A channel layer is formed on the gate insulating layer using the laser ablation process. After that, a source electrode and a drain electrode are formed on the channel layer at both sides of the gate electrode through laser ablation. The gate electrode, the channel layer, the source electrode, and the drain electrode constitute a TFT. Next, a passivation layer is formed on the gate insulating layer and the TFT, and a contact opening is formed in the passivation layer by the laser ablation process to expose a portion of the drain. Thereafter, a pixel electrode is formed on the passivation layer by the laser ablation process, and the pixel electrode is connected to the drain electrode through the contact opening.

In the method for fabricating a pixel structure according to the present invention, a laser beam is automatically positioned and energy of the laser beam is adjusted by digital exposure, for the convenience of performing the laser ablation process.

In the method for fabricating a pixel structure according to the present invention, a forming method of the third conductive layer includes forming a conductive material layer by a sputtering process. The conductive material layer is, for example, an ITO layer, IZO layer, or other conductive material layers.

In the method for fabricating a pixel structure according to the present invention, after the semiconductor layer is formed, an ohmic contact layer is formed on a surface of the semiconductor layer. In other embodiments, after the ohmic contact layer is formed, a portion of the ohmic contact layer is removed by etching.

In the method for fabricating a pixel structure according to the present invention, energy of the laser beam is substantially between 10 mJ/cm$^2$-500 mJ/cm$^2$.

In the method for fabricating a pixel structure according to the present invention, a wavelength of the laser beam is substantially between 100 mm-400 nm.

According to the present invention, each film layer of the pixel structure is fabricated by the laser ablation process. Thus, the fabrication cost of the photo-mask is lowered and the processes are simplified as compared with the conventional method for fabricating a pixel structure. Further, as the laser ablation process may be performed with a shadow mask, and the shadow mask is simpler than the conventional mask, so the cost is much lower.

In order to make the aforementioned and other objects, features and advantages of the present invention comprehensible, embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2A:
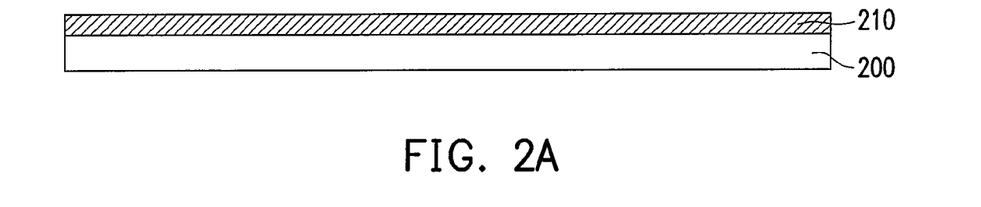
FIGS. 2A to 2O are schematic views of a method for fabricating a pixel structure according to the present invention.
Figure 2B:
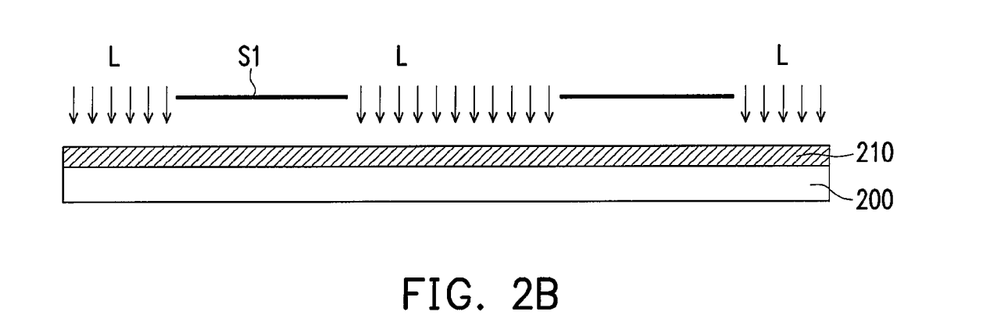
Figure 2C:
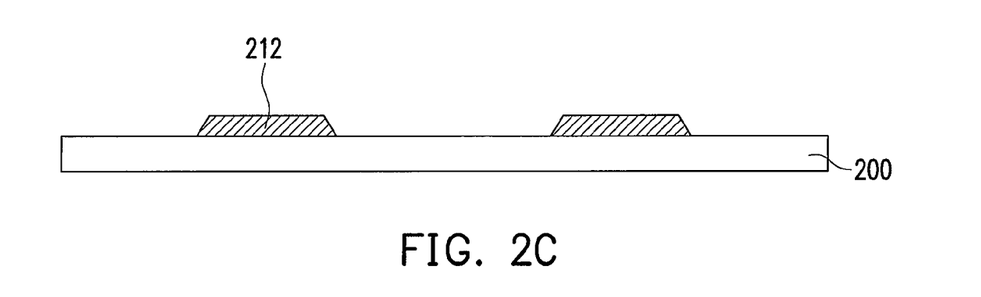
Figure 2D:
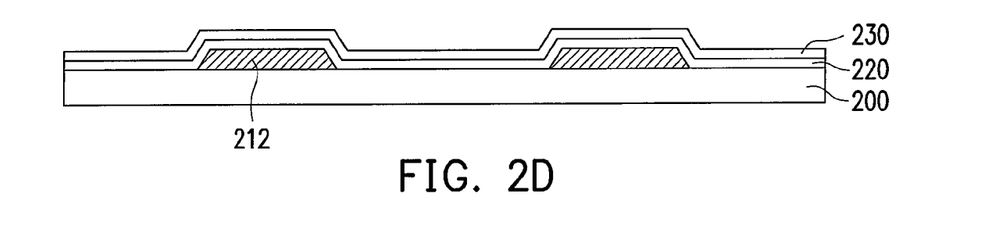
Figure 2E:
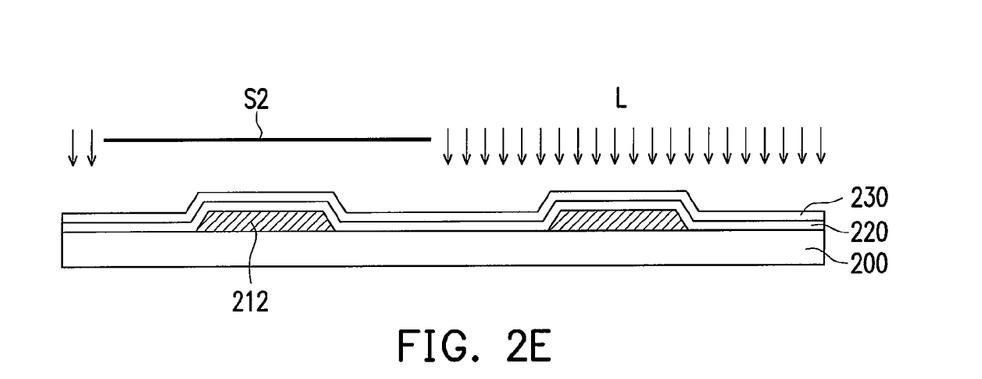
Figure 2F:
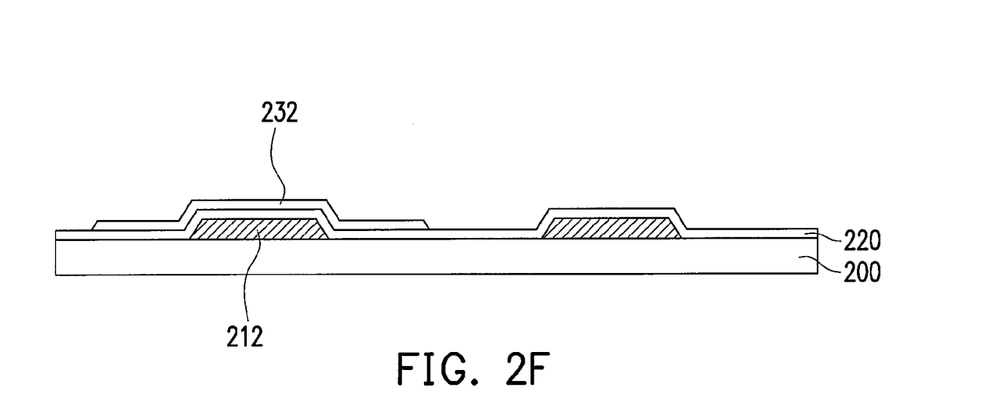
Figure 2G:
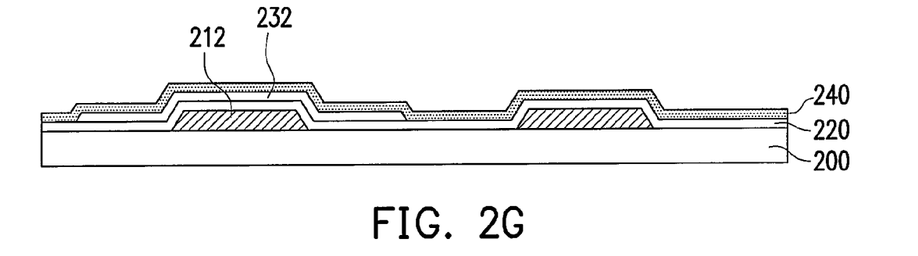
Figure 2H:
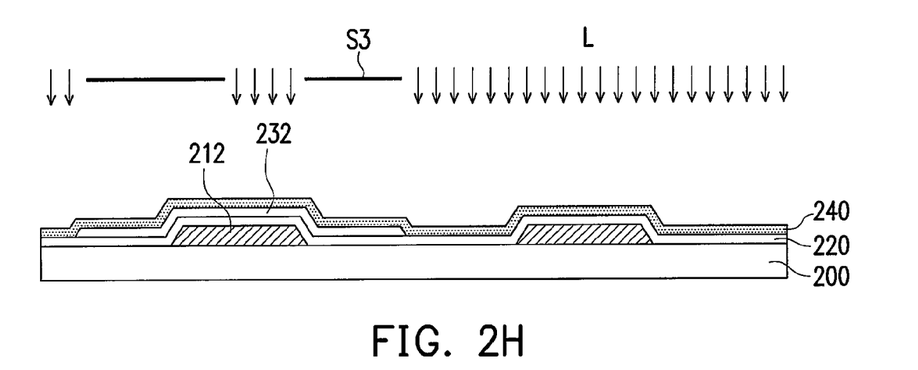
Figure 2I:
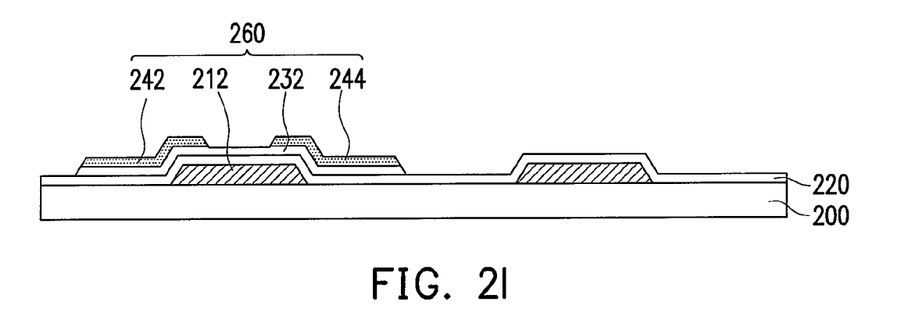
Figure 2J:
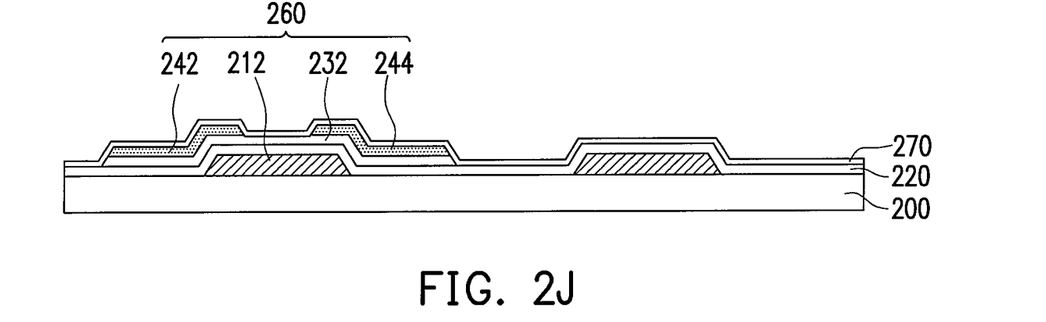
Figure 2K:
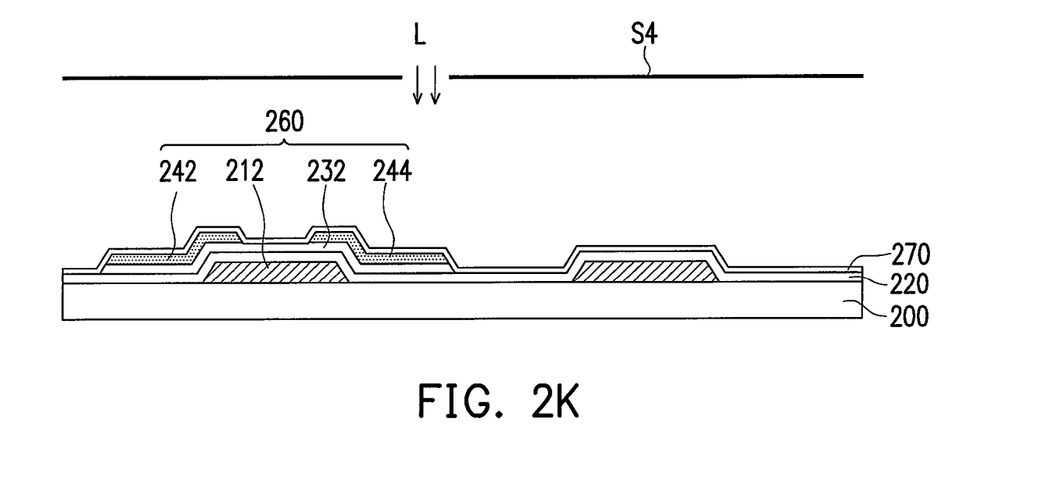
Figure 2L:
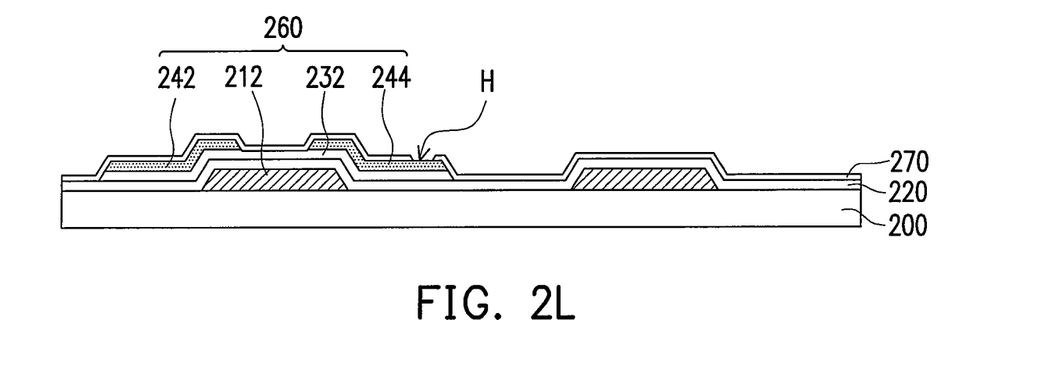
Figure 2M:
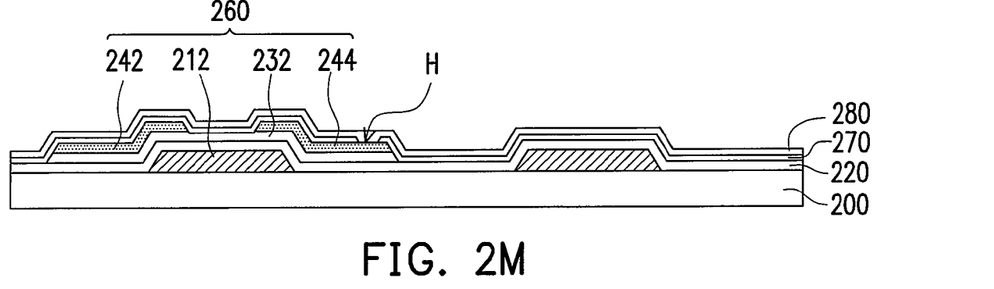
Figure 2N:
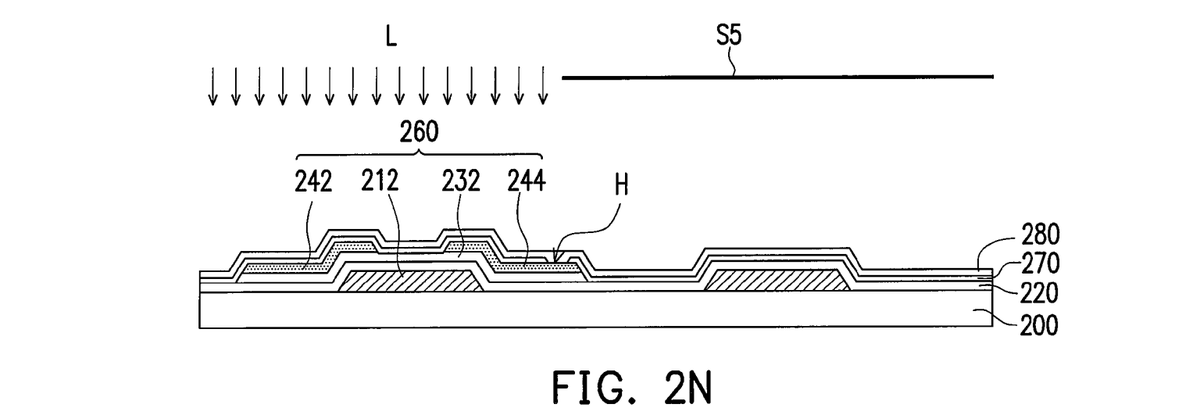
Figure 2O:
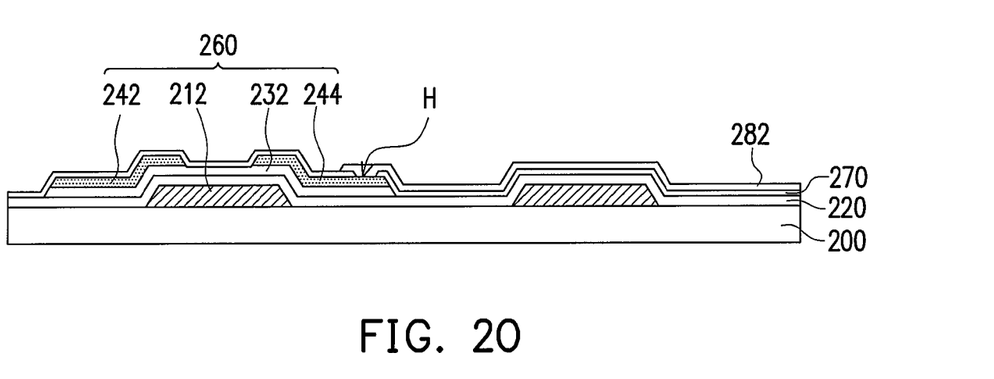

FIGS. 2A to 2O are schematic views of a method for fabricating a pixel structure according to the present invention. Referring to FIG. 2A, first, a substrate 200 is provided, and the material of the substrate 200 is a hard or soft material such as glass and plastic. Next, a first conductive layer 210 is formed on the substrate 200 by, for example, sputtering, evaporation, or other thin film deposition techniques. Afterwards, a gate 212 is formed by the laser ablation process (as shown in FIG. 2C). The material of the first conductive layer 210 is Al, Mo, Ti, Nd, or other conductive materials, as well as nitrides of the above conductive material, for example, MoN, TiN. The first conductive layer 210 may be formed by one or more conductive layer or alloy.

As shown in FIG. 2B, in the laser ablation process, a first shadow mask S1 is provided above the first conductive layer 210, and exposes a portion of the first conductive layer 210. A laser beam L is used to irradiate the first conductive layer 210 through the first shadow mask S1. In detail, after irradiated by the laser beam L, the first conductive layer 210 absorbs the energy of the laser beam L and is ablated from the surface of the substrate 200. For example, the energy of the laser beam L for the ablation of the first conductive layer 210 is between 10 mJ/cm$^2$-500 mJ/cm$^2$, and the wavelength of the laser beam L is between 100 mm-400 nm.

Next, as shown in FIG. 2C, after the portion of the first conductive layer 210 exposed by the first shadow mask S1 is removed, the remaining first conductive layer 210 constitutes the gate electrode 212. It should be noted that unlike the conventional art, the present invention adopts a shadow mask which is relatively cheaper than a photo-mask used in the conventional art to perform the fabrication of the gate, so the cost is lowered.

Thereafter, referring to FIG. 2D, a gate insulating layer 220 is formed on the substrate 200 to cover the gate electrode 212. The gate insulating layer 220 is, for example, formed by chemical vapor deposition (CVD) or other suitable thin film deposition techniques. The material of the gate insulating layer 220 is a dielectric material such as silicon oxide, silicon nitride, or silicon oxynitride. Next, as shown in FIG. 2D, a semiconductor layer 230 is formed on the gate insulating layer 220. In this embodiment, the material of the semiconductor layer 230 is, for example, amorphous silicon, n+ amorphous silicon, or other suitable semiconductor materials. Afterwards, the semiconductor layer 230 on the gate insulating layer 220 forms a channel layer 232 by the laser ablation process (as shown in FIG. 2F).

As shown in FIG. 2E, in the laser ablation process, a second shadow mask S2 is provided above the semiconductor layer 230, and the second shadow mask S2 exposes a portion of the semiconductor layer 230. A laser beam L is used to irradiate the semiconductor layer 230 through the second shadow mask S2. In detail, after irradiated by the laser beam L, the semiconductor layer 230 absorbs the energy of the laser beam L and is ablated from the surface of the gate insulating layer 220. For example, the energy of the laser beam L for the ablation of the semiconductor layer 230 is between 10-500 mJ/cm$^2$, and the wavelength of the laser beam L is between 100-400 nm.

Referring to FIG. 2F, after the portion of the semiconductor layer 230 exposed by the second shadow mask S2 is removed, the remaining semiconductor layer 230 constitutes the channel layer 232. It should be noted that unlike the conventional art, the present invention adopts a shadow mask which is relatively cheaper than the photo-mask used in the conventional art to perform the fabrication of the channel layer, so the cost is lowered.

Next, referring to FIG. 2G, a second conductive layer 240 is formed on the channel layer 232 and the gate insulating layer 220. The material of the second conductive layer 240 is Al, Mo, Ti, Nd, or other conductive materials, as well as its nitrides, for example, MoN, TiN. The second conductive layer 240 may be formed by one or more conductive layer or alloy.

After that, a source 242 and a drain 244 are formed on the channel layer 232 at two sides of the gate electrode 212 using the laser ablation process (as shown in FIG. 2I).

As shown in FIG. 2H, in the laser ablation process, a third shadow mask S3 is provided above the second conductive layer 240, and the third shadow mask S3 exposes a portion of the second conductive layer 240. A laser beam L is used to irradiate the second conductive layer 240 through the third shadow mask S3. In detail, after irradiated by the laser beam L, the second conductive layer 240 absorbs the energy of the laser beam L and is ablated from the surfaces of the gate insulating layer 220 and the channel layer 232. For example, the energy of the laser beam L for the ablation of the second conductive layer 240 is substantially between 10 mJ/cm$^2$-500 mJ/cm$^2$, and the wavelength of the laser beam L is between 100 mm-400 nm.

As shown in FIG. 2I, after the portion of the second conductive layer 240 exposed by the third shadow mask S3 is removed, a source electrode 242 and a drain electrode 244 are formed on the channel layer 232 at both sides of the gate electrode 212. The gate electrode 212, the channel layer 232, the source electrode 242, and the drain electrode 244 constitute a TFT 260. It should be noted that unlike the conventional art, the present invention adopts a shadow mask which is relatively cheaper than the photo-mask used in the conventional art to perform the fabrication of the source and the drain, so the cost is lowered.

It should be noted that, in the method for fabricating a pixel structure according to the present invention, an ohmic contact layer 234 is first formed on the surface of the semiconductor layer 230. Then, a portion of the ohmic contact layer 234 is removed by etching, as shown in FIG. 2I', such that the ohmic contact layer 234 is formed between the channel layer 232 and the source electrode 242 and between the channel layer 232 and the drain electrode 244. For example, an N-doped region may be formed on the surface of the semiconductor layer 230 (as shown in FIG. 2D) by ion doping, so as to reduce the contact impedance between the channel layer 232 and the source electrode 242 and between the channel layer 232 and the drain electrode 244.

Continuously referring to FIG. 2J, a passivation layer 270 is formed on the gate insulating layer 220 and the TFT 260. In this embodiment, the material of the passivation layer 270 is, for example, silicon nitride or silicon oxide, and the passivation layer 270 is, for example, completely deposited on the substrate 200 by physical vapor deposition (PVD) or CVD. After that, a contact opening H is formed in the passivation layer 270 using the laser ablation process (as shown in FIG. 2L).

As shown in FIG. 2K, in the laser ablation process, a laser beam L is used to irradiate the passivation layer 270 through a fourth shadow mask S4. After irradiated by the laser beam L, the passivation layer 270 absorbs the energy of the laser beam L and is ablated from the surface of the TFT 260, leaving the portion covered by the fourth shadow mask S4. For example, the energy of the laser beam L for the ablation of the passivation layer 270 is substantially between 10 mJ/cm$^2$-500 mJ/cm$^2$, and the wavelength of the laser beam L is substantially between 100 mm-400 nm.

As shown in FIG. 2L, after the portion of the passivation layer 270 exposed by the fourth shadow mask S4 is removed, a contact opening H is formed in the passivation layer 270 to expose a portion of the drain electrode 244. It should be noted that unlike the conventional art, the present invention adopts a shadow mask which is relatively cheaper than the photo-mask used in the conventional art to perform the fabrication of the contact opening of the passivation layer, so the cost is lowered.

Referring to FIG. 2M, a third conductive layer 280 is formed to cover the passivation layer 270. The method of forming the third conductive layer 280 includes, for example, forming a conductive material layer, for example, an ITO layer, IZO layer, or other conductive material layers by sputtering. After that, a pixel electrode 282 is formed on the passivation layer 270 using the laser ablation process (as shown in FIG. 2O).

As shown in FIG. 2N, in the laser ablation process, a laser beam L is used to irradiate the third conductive layer 280 through a fifth shadow mask S5. After being irradiated by the laser beam L, the third conductive layer 280 absorbs the energy of the laser beam L and is ablated from the surface of the passivation layer 270, leaving the portion covered by the fifth shadow mask S5. For example, the energy of the laser beam L for the ablation of the third conductive layer 280 is substantially between 10 mJ/cm$^2$-500 mJ/cm$^2$, and the wavelength of the laser beam L is substantially between 100 mm-400 nm.

After that, as shown in FIG. 2O, after the portion of the third conductive layer 280 exposed by the fifth shadow mask S5 is removed, the remaining third conductive layer 280 forms a pixel electrode 282, in which the pixel electrode 282 is connected to the drain 244 through the contact opening H. It should be noted that unlike the conventional art, the present invention adopts a shadow mask which is relatively cheaper than the photo-mask used in the conventional art to perform the fabrication of the pixel electrode, so the cost is lowered.

In view of the above, the present invention adopts the laser ablation process for fabricating each film layer of the pixel structure, instead of using the conventional photolithography and etching process, so the method for fabricating a pixel structure provided by the present invention has at least the following advantages:

1. In the method for fabricating a pixel structure provided by the present invention, the process for fabricating each film layer does not require an expensive and high-precision photolithography and etching process, so the fabrication cost of the pixel structure is lowered as compared with the conventional processes.

2. As the processes for fabricating each film layer does not include the photolithography process, defects generated in the fabrication of a pixel structure using complicated photolithography and etching processes (such as photoresist coating, soft-bake, hard-bake, exposure, developing, etching, and stripping) may be reduced.

3. The laser ablation process provided by the present invention may be used to repair the pixel structure, for example, to repair the short circuit of the pixel electrode, so as to remove the possible pixel electrode residue to solve the short circuit of the pixel electrode, and further to improve the production yield.

4. Further, the embodiment of the present invention includes automatically positioning and adjusting the energy of a laser beam by digital exposure, for the convenience of performing the laser ablation process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a pixel structure, comprising:
providing a substrate;
forming a first conductive layer on the substrate;
providing a first shadow mask above the first conductive layer, wherein the first shadow mask exposes a portion of the first conductive layer;
irradiating the first conductive layer through the first shadow mask with a laser beam, wherein the laser beam directly irradiates into the portion of the first conductive layer exposed by the first shadow mask so as to directly remove the portion of the first conductive layer to form a gate electrode;
forming a gate insulating layer on the substrate to cover the gate electrode;
forming a semiconductor layer on the gate insulating layer;
providing a second shadow mask above the semiconductor layer, wherein the second shadow mask exposes a portion of the semiconductor layer;
irradiating the semiconductor layer through the second shadow mask with a laser beam, wherein the laser beam directly irradiates into the portion of the semiconductor layer exposed by the second shadow mask so as to directly remove the portion of the semiconductor layer to form a channel layer;
forming a second conductive layer on the channel layer and the gate insulating layer;
providing a third shadow mask above the second conductive layer, wherein the third shadow mask exposes a portion of the second conductive layer;
irradiating the second conductive layer through the third shadow mask with a laser beam, wherein the laser beam directly irradiates into the portion of the second conductive layer exposed by the third shadow mask so as to form a source electrode and a drain electrode on the channel layer at both sides of the gate electrode, wherein the gate electrode, the channel layer, the source electrode, and the drain electrode constitute a thin film transistor (TFT);
forming a passivation layer on the gate insulating layer and the TFT;
providing a fourth shadow mask above the passivation layer, wherein the fourth shadow mask exposes a portion of the passivation layer;
irradiating the passivation layer through the fourth shadow mask with a laser beam, wherein the laser beam directly irradiates into the portion of the passivation layer exposed by the fourth shadow mask so as to form a contact opening in the passivation layer, wherein the contact opening exposes a portion of the drain electrode;
forming a third conductive layer to cover the passivation layer;
providing a fifth shadow mask above the third conductive layer, wherein the fifth shadow mask exposes a portion of the third conductive layer; and
irradiating the third conductive layer through the fifth shadow mask with a laser beam, wherein the laser beam directly irradiates into the portion of the third conductive layer exposed by the fifth shadow mask so as to make the remaining third conductive layer to form a pixel electrode, wherein the pixel electrode is connected to the drain through the contact opening.

2. The method for fabricating a pixel structure as claimed in claim 1, wherein a method of forming the third conductive layer comprises a sputtering process, and the conductive material layer is an ITO layer or an IZO layer.

3. The method for fabricating a pixel structure as claimed in claim 1, further comprising forming an ohmic contact layer on a surface of the semiconductor layer after the semiconductor layer is formed.

4. The method for fabricating a pixel structure as claimed in claim 3, further comprising removing a portion of the ohmic contact layer after the ohmic contact layer is formed.

5. The method for fabricating a pixel structure as claimed in claim 1, wherein an energy of the laser beam is substantially between 10 mJ/cm$^2$-500 mJ/cm$^2$.

6. The method for fabricating a pixel structure as claimed in claim 1, wherein a wavelength of the laser beam is substantially between 100 mm-400 nm.

7. The method for fabricating a pixel structure as claimed in claim 1, wherein the substrate is glass or plastic.

8. The method for fabricating a pixel structure as claimed in claim 1, wherein the semiconductor layer is amorphous silicon or n+ amorphous silicon.

9. The method for fabricating a pixel structure as claimed in claim 1, wherein a material of the first conductive layer is Al, Mo, Ti, Nd, MoN, TiN, or any combination thereof.

10. The method for fabricating a pixel structure as claimed in claim 1, wherein a material of the second conductive layer is Al, Mo, Ti, Nd, MoN, TiN, or any combination thereof.

11. The method for fabricating a pixel structure as claimed in claim 1, wherein a material of the third conductive layer is ITO or IZO.

12. The method for fabricating a pixel structure as claimed in claim 1, wherein a step of using a laser beam comprises automatically positioning and adjusting the energy of a laser beam by digital exposure.

13. A method for fabricating a pixel structure, comprising:
providing a substrate;
forming a gate electrode on the substrate by a laser ablation process with a first shadow mask;
forming a gate insulating layer on the substrate to cover the gate electrode;
forming a channel layer on the gate insulating layer by the laser ablation process with a second shadow mask;
forming a source electrode and a drain electrode on the channel layer at both sides of the gate electrode by the laser ablation process with a third shadow mask, wherein the gate electrode, the channel layer, the source electrode, and the drain electrode constitute a TFT;
forming a passivation layer on the gate insulating layer and the TFT;
forming a contact opening in the passivation layer by the laser ablation process with a fourth shadow mask, wherein the contact opening exposes a portion of the drain electrode; and
forming a pixel electrode on the passivation layer by the laser ablation process with a fifth shadow mask, wherein the pixel electrode is connected to the drain electrode through the contact opening.

14. The method for fabricating a pixel structure as claimed in claim 13, wherein an energy of the laser beam is substantially between 10 mJ/cm$^2$-500 mJ/cm$^2$.

15. The method for fabricating a pixel structure as claimed in claim 13, wherein a wavelength of the laser beam is substantially between 100 mm-400 nm.

16. The method for fabricating a pixel structure as claimed in claim 13, wherein the substrate is glass or plastic.

17. The method for fabricating a pixel structure as claimed in claim 13, wherein the semiconductor layer is amorphous silicon or n+ amorphous silicon.

18. The method for fabricating a pixel structure as claimed in claim 13, wherein a material of the first conductive layer is Al, Mo, Ti, Nd, MoN, TiN, or any combination thereof.

19. The method for fabricating a pixel structure as claimed in claim 13, wherein a material of the second conductive layer is Al, Mo, Ti, Nd, MoN, TiN, or any combination thereof.

20. The method for fabricating a pixel structure as claimed in claim 13, wherein a material of the third conductive layer is ITO or IZO.

21. The method for fabricating a pixel structure as claimed in claim 13, wherein a step of using a laser beam comprises automatically positioning and adjusting the energy of a laser beam by digital exposure.

* * * * *